(12) United States Patent
Ogata et al.

(10) Patent No.: US 7,705,611 B2
(45) Date of Patent: Apr. 27, 2010

(54) SENSOR DEVICE, AND PORTABLE COMMUNICATION TERMINAL AND ELECTRONIC DEVICE USING THE SENSOR DEVICE

(75) Inventors: Masako Ogata, Yokohama (JP); Kazuhiro Suzuki, Tokyo (JP); Hideyuki Funaki, Tokyo (JP); Kazuhiko Itaya, Yokohama (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 125 days.

(21) Appl. No.: 11/858,822

(22) Filed: Sep. 20, 2007

(65) Prior Publication Data
US 2008/0181353 A1    Jul. 31, 2008

(30) Foreign Application Priority Data
Jan. 31, 2007    (JP) .............................. 2007-022249

(51) Int. Cl.
*G01R 27/26* (2006.01)
(52) U.S. Cl. ...................................... 324/661; 324/658
(58) Field of Classification Search ................. 324/661, 324/658, 649, 600, 662, 635, 644, 699, 716
See application file for complete search history.

(56) References Cited

U.S. PATENT DOCUMENTS

| | | | | |
|---|---|---|---|---|
| 5,019,804 A | * | 5/1991 | Fraden | ....................... 340/562 |
| 5,557,185 A | * | 9/1996 | Jacobsen et al. | ....... 318/568.16 |
| 7,119,550 B2 | * | 10/2006 | Kitano et al. | ................ 324/658 |
| 2006/0055534 A1 | | 3/2006 | Fergusson | .................... 340/562 |

FOREIGN PATENT DOCUMENTS

| | | |
|---|---|---|
| JP | 2006-162374 | 6/2006 |
| WO | WO2004/059343 | 7/2004 |

OTHER PUBLICATIONS

International Search Reaport dated Dec. 27, 2007 based on corresponding European Patent Application No. 07018734.

* cited by examiner

*Primary Examiner*—Hoai-An D Nguyen
(74) *Attorney, Agent, or Firm*—Ohlandt, Greeley, Ruggiero & Perle, L.L.P.

(57) ABSTRACT

A sensor device for detecting a positional relationship between a first member and a second member, includes a first charge-holding electrode provided on a surface of the first member and holding a charge, a second charge-holding electrode provided on the surface of the first member and holding a charge differing from the charge held by the first charge-holding electrode, a first charge-induced electrode provided on a surface of the second member, the first charge-induced electrode having a charge induced therein in accordance with the charge held by the first charge-holding electrode, when the first charge-holding electrode approaches the first charge-induced electrode, a second charge-induced electrode provided on the surface of the second member, the second charge-induced electrode having a charge induced therein in accordance with the charge held by the second charge-holding electrode, when the second charge-holding electrode approaches the second charge-induced electrode.

17 Claims, 7 Drawing Sheets

SENSOR DEVICE, AND PORTABLE COMMUNICATION TERMINAL AND ELECTRONIC DEVICE USING THE SENSOR DEVICE

CROSS-REFERENCE TO RELATED APPLICATIONS

This application is based upon and claims the benefit of priority from prior Japanese Patent Application No. 2007-022249, filed Jan. 31, 2007, the entire contents of which are incorporated herein by reference.

BACKGROUND OF THE INVENTION

1. Field of the Invention

The present invention relates to a sensor device, and a portable communication terminal and electronic device using the sensor device.

2. Description of the Related Art

In recent years, proximity sensors that monitors changes in capacitance have been proposed as sensors for detecting the proximity of an object (see, for example, International Publication No. 2004/059343). These capacitance detection sensors can detect the proximity of an object without contacting it.

However, conventional proximity sensors as disclosed in International Publication No. 2004/059343 basically detect the proximity of all objects. Accordingly, they are not suitable for detecting a particular detection target. For instance, to detect the opening/closing of a lid or door, the proximity of only the lid or door should be detected. Actually, however, conventional sensors detect other objects besides the lid or door.

As described above, it is difficult for conventional proximity sensors to reliably detect only a particular detection target.

BRIEF SUMMARY OF THE INVENTION

In accordance with a first aspect of the invention, there is provided a sensor device for detecting a positional relationship between a first member and a second member, comprising: a first charge-holding electrode provided on a surface of the first member and holding a charge; a second charge-holding electrode provided on the surface of the first member and holding a charge differing from the charge held by the first charge-holding electrode; a first charge-induced electrode provided on a surface of the second member, the first charge-induced electrode having a charge induced therein in accordance with the charge held by the first charge-holding electrode, when the positional relationship between the first and second members changes to cause the first charge-holding electrode to approach the first charge-induced electrode; a second charge-induced electrode provided on the surface of the second member, the second charge-induced electrode having a charge induced therein in accordance with the charge held by the second charge-holding electrode, when the positional relationship between the first and second members changes to cause the second charge-holding electrode to approach the second charge-induced electrode; and a difference detector which generates a difference detection signal when a difference between the charge induced in the first charge-induced electrode and the charge induced in the second charge-induced electrode is greater than a preset value.

In accordance with a second aspect of the invention, there is provided a sensor device for detecting a positional relationship between a first substrate and a second substrate, comprising: a first charge-holding electrode provided on a surface of the first substrate and holding a charge; a second charge-holding electrode provided on the surface of the first substrate and holding a charge differing from the charge held by the first charge-holding electrode; a first charge-induced electrode provided on a surface of the second substrate, the first charge-induced electrode having a charge induced therein in accordance with the charge held by the first charge-holding electrode, when the positional relationship between the first and second substrates changes to cause the first charge-holding electrode to approach the first charge-induced electrode; a second charge-induced electrode provided on the surface of the second substrate, the second charge-induced electrode having a charge induced therein in accordance with the charge held by the second charge-holding electrode, when the positional relationship between the first and second substrates changes to cause the second charge-holding electrode to approach the second charge-induced electrode; and a difference detector which generates a difference detection signal when a difference between the charge induced in the first charge-induced electrode and the charge induced in the second charge-induced electrode is greater than a preset value.

In accordance with a third aspect of the invention, there is provided a sensor device for detecting a positional relationship between a first member and a second member, comprising: a first electrode provided on a surface of the first member and supplied with an alternating signal of a first frequency; a second electrode provided on a surface of the second member and supplied with an alternating signal of a second frequency; and a beat detector which detects a beat frequency component corresponding to a difference between the first and second frequencies, when the positional relationship between the first and second members changes to cause the first electrode to approach the second electrode.

In accordance with a fourth aspect of the invention, there is provided a sensor device for detecting a positional relationship between a first substrate and a second substrate, comprising: a first electrode provided on a surface of the first substrate and supplied with an alternating signal of a first frequency; a second electrode provided on a surface of the second substrate and supplied with an alternating signal of a second frequency; and a beat detector which detects a beat frequency component corresponding to a difference between the first and second frequencies, when the positional relationship between the first and second substrates changes to cause the first electrode to approach the second electrode.

In accordance with a fifth aspect of the invention, there is provided an electronic device comprising: a first member and a second member movable relative to each other; a first charge-holding electrode provided on a surface of the first member and holding a charge; a second charge-holding electrode provided on the surface of the first member and holding a charge differing from the charge held by the first charge-holding electrode; a first charge-induced electrode provided on a surface of the second member, the first charge-induced electrode having a charge induced therein in accordance with the charge held by the first charge-holding electrode, when the positional relationship between the first and second members changes to cause the first charge-holding electrode to approach the first charge-induced electrode; a second charge-induced electrode provided on the surface of the second member, the second charge-induced electrode having a charge induced therein in accordance with the charge held by the second charge-holding electrode, when the positional relationship between the first and second members changes to cause the second charge-holding electrode to approach the second charge-induced electrode; and a difference detector which generates a difference detection signal when a difference between the charge induced in the first charge-induced electrode and the charge induced in the second charge-induced electrode is greater than a preset value.

DETAILED DESCRIPTION OF THE INVENTION

Embodiments of the invention will be described with reference to the accompanying drawings.

Figure 1:
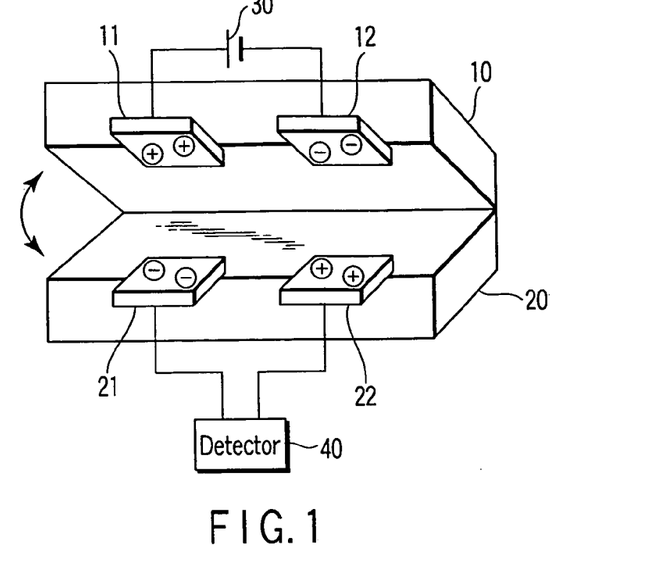
FIG. 1 is a schematic view illustrating the structure of a sensor device according to an embodiment of the invention.

FIG. 1 is a schematic view illustrating the structure of a sensor device according to an embodiment of the invention. The sensor device of FIG. 1 detects the open/closed states of the first and second members 10 and 20.

On the first member 10, a first charge-holding electrode 11 and second charge-holding electrode 12 are provided adjacent to each other. The first and second charge-holding electrodes 11 and 12 hold different charges. For instance, the charges held by the first and second charge-holding electrodes 11 and 12 may differ in polarity. Alternatively, the charges may differ in absolute value. The first and second charge-holding electrodes 11 and 12 are connected to a power supply 30 as a charge supply unit for supplying charges to them.

On the second member 20, a first charge-induced electrode 21 and second charge-induced electrode 22 are provided adjacent to each other. When the members 10 and 20 are closed, the first charge-holding electrode 11 faces the first charge-induced electrode 21 and the second charge-holding electrode 12 faces the second charge-induced electrode 22. Accordingly, when the members 10 and 20 becomes closed state, the first charge-holding electrode 11 is positioned close to the first charge-induced electrode 21, and the second charge-holding electrode 12 is positioned close to the second charge-induced electrode 22. As a result, charges corresponding to the charges held by the first and second charge-holding electrodes 11 and 12 are induced in the first and second charge-induced electrodes 21 and 22, respectively. Accordingly, different charges are induced in the first and second charge-induced electrodes 21 and 22.

A difference detector 40 is connected to the first and second charge-induced electrodes 21 and 22. When the difference between the charges induced in the electrodes 21 and 22 is higher than a preset value, the difference detector 40 generates a difference detection signal. Namely, when the members 10 and 20 are closed, different charges are induced in the first and second charge-induced electrodes 21 and 22, and the difference between the induced charges is higher than a preset value. As a result, the difference detector 40 generates a difference detection signal. In contrast, when the members 10 and 20 are open, the first and second charge-induced electrodes 21 and 22 are out of influence of the first and second charge-holding electrodes 11 and 12, and hence no charges are induced in the first and second charge-induced electrodes 21 and 22. Accordingly, the difference detector 40 generates no difference detection signal.

As described above, in the embodiment, the first and second charge-holding electrodes 11 and 12 hold different charges. Therefore, when the members 10 and 20 are closed, different charges are induced in the first and second charge-induced electrodes 21 and 22. Namely, when the first and second charge-holding electrodes 11 and 12 are made to approach the first and second charge-induced electrodes 21 and 22, respectively in accordance with a change in position between the members 10 and 20, different charges can be induced in the first and second charge-induced electrodes 21 and 22. Therefore, the open/closed states of the members 10 and 20 can be reliably detected by detecting the difference between the induced charges.

When a substance other than the first and second charge-holding electrodes 11 and 12 comes close to the first and second charge-induced electrodes 21 and 22, the same charge is induced therein and no difference is detected. Thus, only the approach of the first and second charge-holding electrodes 11 and 12 to the first and second charge-induced electrodes 21 and 22 can be reliably detected.

Further, the first and second charge-holding electrodes 11 and 12 can be arranged on a single plane, and the first and second charge-induced electrodes 21 and 22 can also be arranged on a single plane. This enables the open/closed states to be reliably detected without increasing the installation areas of the electrodes.

By virtue of the above structure, only the proximity of a particular detection target can be reliably detected without using a large complex device.

Figure 2:
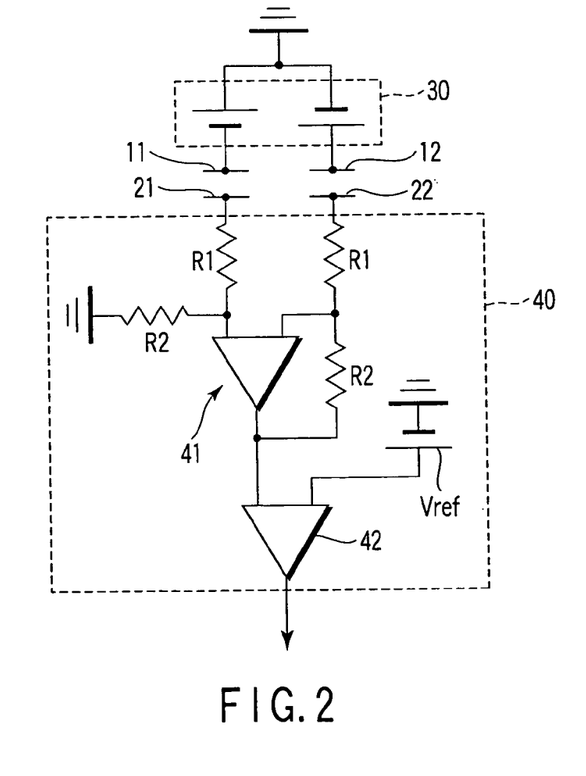
FIG. 2 is a circuit diagram illustrating the outline of the circuitry of the sensor device of the embodiment.

FIG. 2 is a circuit diagram illustrating the outline of the circuitry of the sensor device of the embodiment.

As shown in FIG. 2, the first and second charge-induced electrodes 21 and 22 are connected to a differential amplifier 41. When the members 10 and 20 are open, the difference input to the differential amplifier 41 is zero (or substantially zero), the difference signal output from the differential amplifier 41 is zero (or substantially zero). In contrast, when the members 10 and 20 are closed, the difference input to the differential amplifier 41 is higher than a preset value, and hence the difference signal output from the differential amplifier 41 is at high level.

The difference signal output from the differential amplifier 41 is input to one input terminal of a comparator 42. A reference voltage Vref is applied to the other input terminal of the comparator 42. Therefore, when the level of the difference signal output from the differential amplifier 41 is higher than the reference voltage Vref, the comparator 42 generates a difference detection signal. In contrast, when the level of the difference signal output from the differential amplifier 41 is lower than the reference voltage Vref, the comparator 42 generates no difference detection signal.

As described above, when the state of the members 10 and 20 is shifted from the open state to the closed state, and the level of the difference signal input to the comparator 42 becomes higher than the reference voltage Vref, the comparator 42 outputs a difference detection signal indicating that the state of the members 10 and 20 has been shifted to the closed state.

The distance between the first (second) charge-holding electrode 11 (12) and the first (second) charge-induced electrode 21 (22), assumed when the members 10 and 20 are closed, is set depending upon the equipment to which the sensor is applied. Further, the charge induced in the first (second) charge-induced electrode 21 (22) is varied in accordance with the distance between the first (second) charge-holding electrode 11 (12) and the first (second) charge-induced electrode 21 (22). Accordingly, it is desirable that the charges held by the first and second charge-holding electrodes 11 and 12 be set variable in order to carry out suitable detection for the equipment to which the sensor is applied. Specifically, it is desirable to set the power supply 30 as a variable voltage power supply. When the charges held by the first and second charge-holding electrodes 11 and 12 are set variable, accurate sensitivity adjustment can be realized to thereby enhance the accuracy of detection.

In view of executing accurate sensitivity adjustment, the gain of the differential amplifier 41 may be set variable. Further, the reference voltage Vref may be set variable.

Furthermore, in view of enhancing the accuracy of detection, respective amplifier circuits may be provided between the first charge-induced electrode 21 and differential amplifier 41 and between the second charge-induced electrode 22 and differential amplifier 41.

Although, in the example of FIG. 2, a positive power terminal is connected to the second charge-holding electrodes 12, and a negative power terminal is connected to the first charge-holding electrode 11, the positive terminal may be connected to one of the first and second charge-holding electrodes 11 and 12, and the other charge-holding electrode may be grounded. In this case, the one charge-holding electrode is charged with positive electricity, and the other charge-holding electrode is charged with no electricity. Thus, the first and second charge-holding electrodes 11 and 12 hold charges of different absolute values, which enables accurate difference detection. This power-supply structure is employed for devices, such as cellular phones, which do not have a negative power supply.

The comparator 42 is not always necessary. As described above, when the members 10 and 20 are open, the difference signal output from the differential amplifier 41 is zero (or substantially zero). This state is treated as a logical value of "0." In contrast, when the members 10 and 20 are closed, a large difference signal is output from the differential amplifier 41. This state is treated as a logical value of "1."

FIGS. 3 to 6 show examples in which the sensor device of the embodiment is applied to a portable communication terminal. The portable communication terminal is supposed to be a cellular phone.

In FIGS. 3 to 6, the members 10 and 20 correspond to the upper and lower members of the cellular phone, respectively. The charge-holding electrodes 11 and 12 are provided in a charge-holding electrode arrangement area 100, and charge-induced electrodes 21 and 22 are provided in a charge-induced electrode arrangement area 200. Further, respective communication function units are provided in the members 10 and 20.

Figure 3:
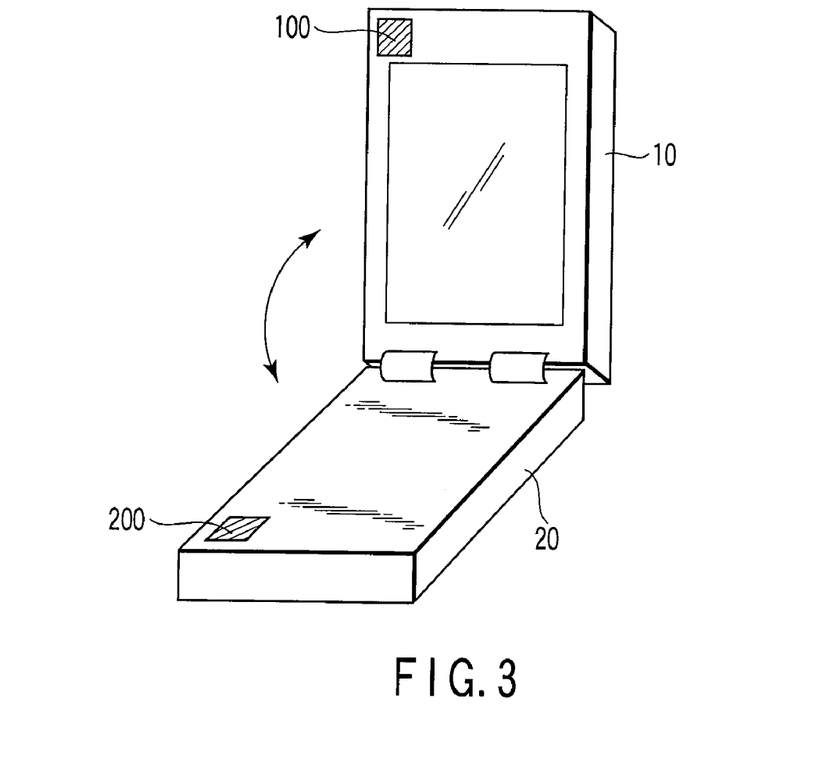
FIG. 3 is a perspective view illustrating an example in which the sensor device of the embodiment is applied to a portable communication terminal.

FIG. 3 shows an opening/closing type cellular phone. When the members 10 and 20 are moved as indicated by the arrow in FIG. 3 to cause the charge-holding electrode arrangement area 100 and charge-induced electrode arrangement area 200 to approach each other, it is detected that the members 10 and 20 are closed.

Figure 4:
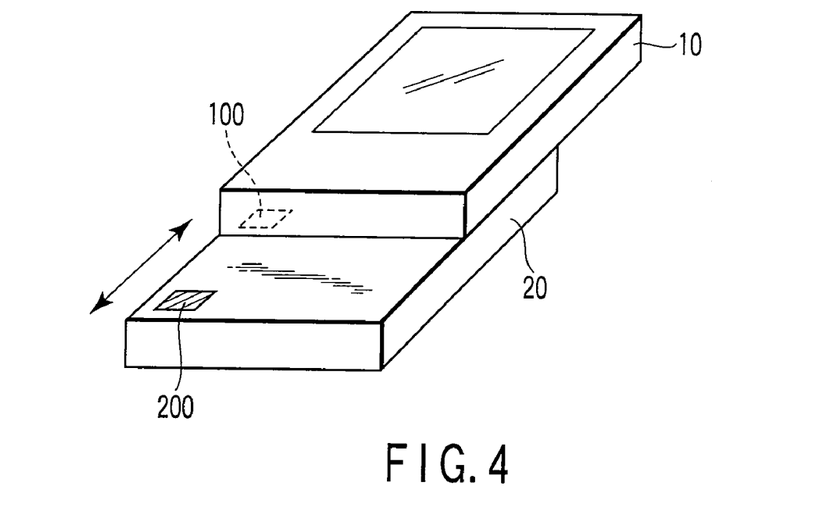
FIG. 4 is a perspective view illustrating another example in which the sensor device of the embodiment is applied to a portable communication terminal.

FIG. 4 shows a slide cellular phone. When the members 10 and 20 are slid as indicated by the arrow in FIG. 4 to cause the charge-holding electrode arrangement area 100 and charge-induced electrode arrangement area 200 to approach each other, it is detected that the members 10 and 20 are closed.

Figure 5:
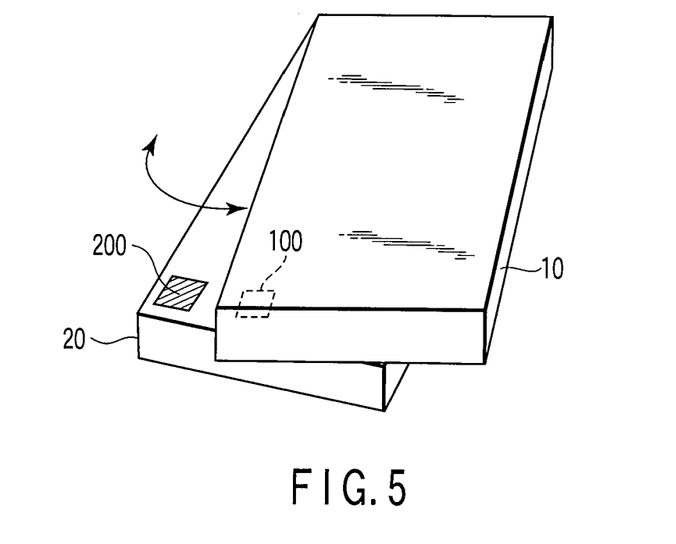
FIG. 5 is a perspective view illustrating yet another example in which the sensor device of the embodiment is applied to a portable communication terminal.

FIG. 5 shows a rotary cellular phone. When the members 10 and 20 are rotated relative to each other as indicated by the arrow in FIG. 5 to cause the charge-holding electrode arrangement area 100 and charge-induced electrode arrangement area 200 to approach each other, it is detected that the members 10 and 20 are closed.

Figure 6:
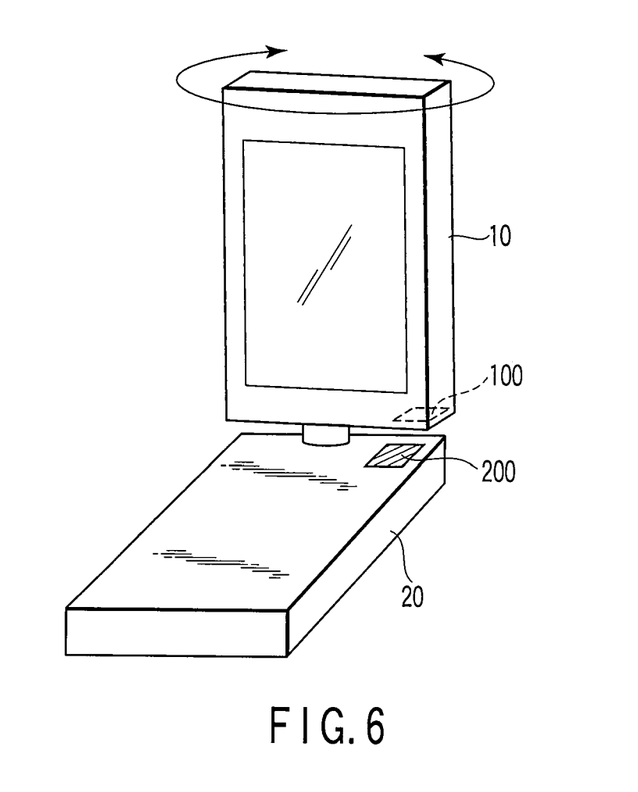
FIG. 6 is a perspective view illustrating another example in which the sensor device of the embodiment is applied to a portable communication terminal.

FIG. 6 shows another rotary cellular phone. When the members 10 and 20 are rotated relative to each other as indicated by the arrow in FIG. 6 to cause the charge-holding electrode arrangement area 100 and charge-induced electrode arrangement area 200 to approach each other, it is detected that the members 10 and 20 are rotated relative to each other.

Figure 7:
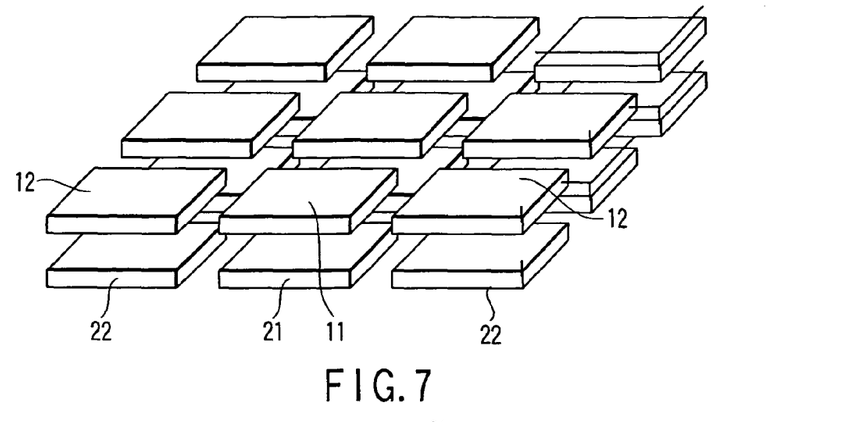
FIG. 7 is a schematic view illustrating a structure employed in the embodiment, in which a plurality of electrodes are arranged.

In the example shown in FIG. 1, the sensor comprises the two charge-holding electrodes 11 and 12 and two charge-induced electrodes 21 and 22. However, it may comprise three or more charge-holding electrodes and three or more charge-induced electrodes as shown in FIG. 7. Specific examples of the structure will be described.

Figure 8:
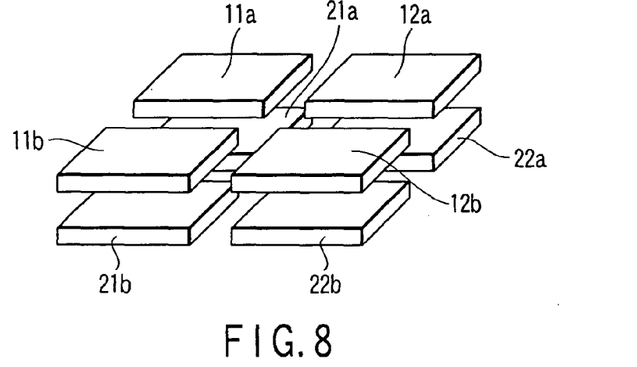
FIG. 8 is a schematic view illustrating a modification of the electrode arrangement of the sensor device of the embodiment.
Figure 9:
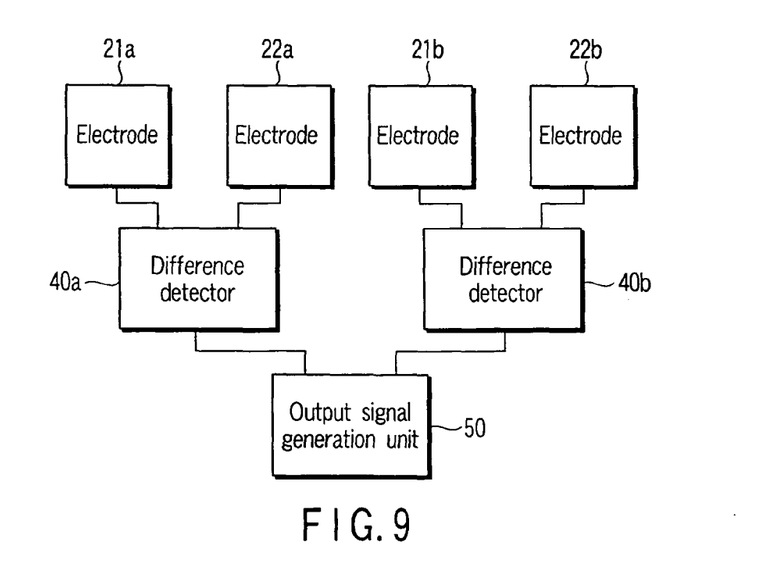
FIG. 9 is a block diagram illustrating a circuit example employed in the sensor device of FIG. 8.

FIGS. 8 and 9 show an example that comprises a plurality of sensor (detection) units shown in FIG. 1, each of the units including the first and second charge-holding electrodes 11 and 12, first and second charge-induced electrodes 21 and 22, and difference detector 40. FIG. 8 mainly shows arrangement of electrodes, while FIG. 9 mainly shows a circuit structure.

As shown in FIGS. 8 and 9, one sensor unit is formed of charge-holding electrodes 11a and 12a, charge-induced electrodes 21a and 22a, and a difference detector 40a. Further, another sensor unit is formed of charge-holding electrodes 11b and 12b, charge-induced electrodes 21b and 22b, and a difference detector 40b. The difference detectors 40a and 40b are connected to an output-signal generation unit 50. Examples of the output-signal generation unit 50 will now be described.

A first example of the output-signal generation unit 50 generates an output signal when all difference detectors output difference detection signals. Namely, this output-signal generation unit 50 serves as an AND circuit. In the example shown in FIGS. 8 and 9, when both the difference detectors 40a and 40b output difference detection signals, the unit 50 generates an output signal. This structure can prevent erroneous operations, and reliably detect proximity of a detection target.

A second example of the output-signal generation unit 50 generates an output signal when at least one difference detector outputs a difference detection signal. Namely, this output-signal generation unit 50 serves as an OR circuit. In the example shown in FIGS. 8 and 9, when at least one of the difference detectors 40a and 40b outputs a difference detection signal, the unit 50 generates an output signal. With this structure, even if one of the detection units cannot perform normal detection, the sensor as a whole can perform normal detection when the other detection unit can perform normal detection. Accordingly, proximity of a detection target can be reliably detected.

Figure 10:
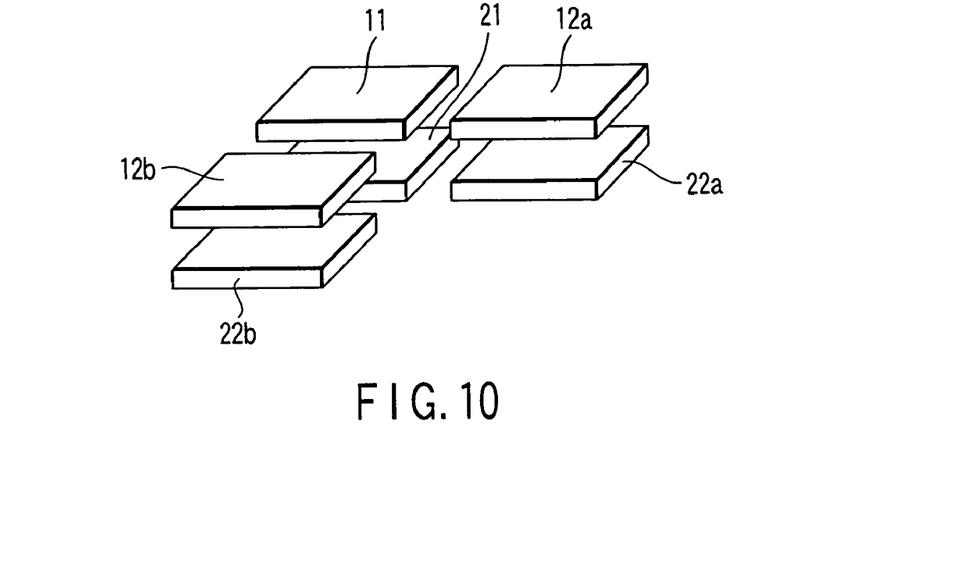
FIG. 10 is a schematic view illustrating a modification of the electrode arrangement of the sensor device of the embodiment.
Figure 11:
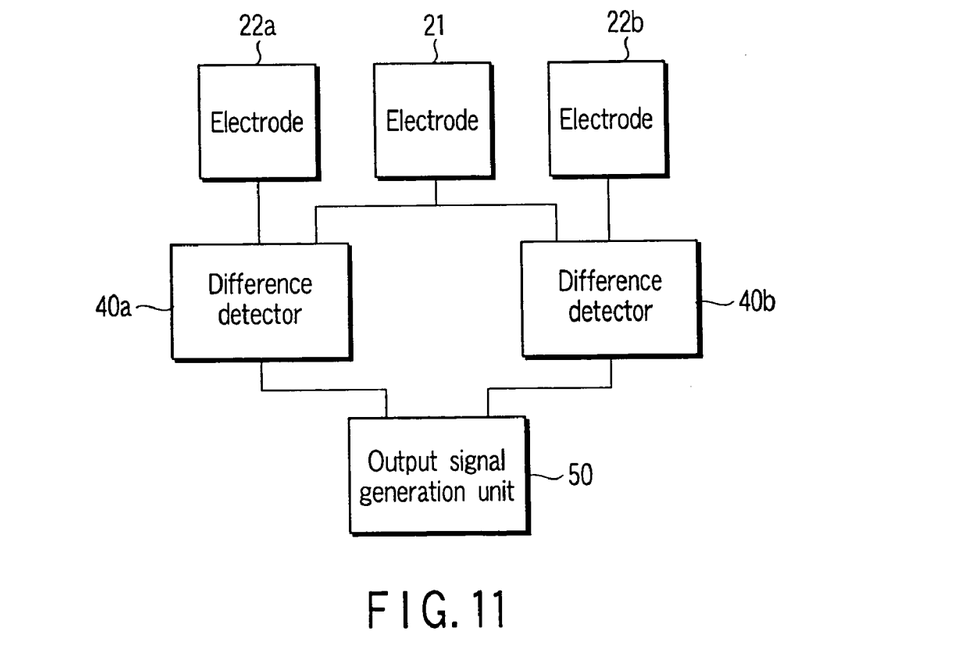
FIG. 11 is a block diagram illustrating a configuration example of a circuit employed in the sensor device of FIG. 10.

FIGS. 10 and 11 show another example that comprises a plurality of sensor (detection) units shown in FIG. 1, each of the units including the first and second charge-holding electrodes 11 and 12, first and second charge-induced electrodes 21 and 22, and difference detector 40. FIG. 10 mainly shows arrangement of electrodes, while FIG. 11 mainly shows a circuit structure.

As shown in FIGS. 10 and 11, one sensor unit is formed of charge-holding electrodes 11 and 12a, charge-induced electrodes 21 and 22a, and a difference detector 40a. Further, another sensor unit is formed of charge-holding electrodes 11 and 12b, charge-induced electrodes 21 and 22b, and a difference detector 40b. The difference detectors 40a and 40b are connected to an output-signal generation unit 50. Like the output-signal generation unit 50 shown in FIG. 9, the output-signal generation unit 50 shown in FIG. 11 cab be made to serve as both an AND circuit and OR circuit, and can provide the same advantages as those described with reference to FIGS. 8 and 9.

Figure 12:
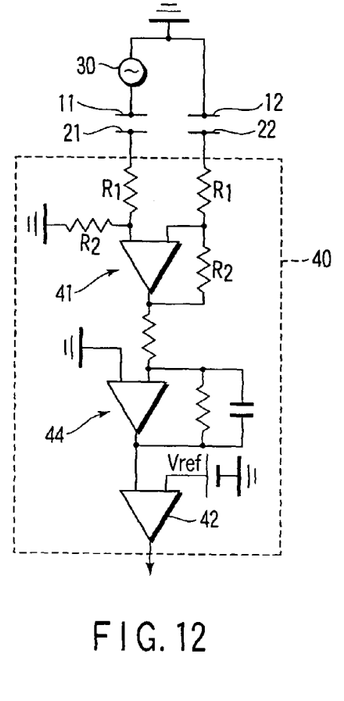
FIG. 12 is a circuit diagram illustrating a modification of the circuitry of the sensor device of the embodiment.

FIG. 12 shows a modification of the circuit of the sensor device according to the embodiment. In this modification, a power supply 30 is an AC power supply, and an integration-type low-pass filter 44 is provided between the differential amplifier 41 and comparator 42. This structure can effectively eliminate noise components and hence can reliably detect proximity of a detection target.

The charge-holding electrodes 11 and 12 may be formed of electret films. Electrets are polymers permanently charged with static electricity. The electrostatic charges include both a plus charge and minus charge, and hence the entire polymer is neutral. Electrets include a film electret and nonwoven fabric electret. The film electret is a polymer film charged with plus electricity on one surface, and minus electricity on the other surface. The polymers include polypropylene (PP), polytetrafluoroethylene (PTFE), 4-fluorinated ethylene-6-fluorinated polypropylene copolymer (FEP), etc. The film electret is formed by subjecting a film to corona discharge. The nonwoven fabric electret is obtained by subjecting nonwoven fabric to corona discharge using a voltage of about minus several tens kV, thereby charging the fabric with plus and minus electricity. Accordingly, the nonwoven fabric electret is neutral as a whole. If charges are beforehand held in these electret films, the power supply 30 for supplying charges to the charge-holding electrodes 11 and 12 can be omitted, thereby enabling the sensor device to be made compact and realizing power saving thereof.

Specific configuration examples of the sensor device of the embodiment will now be described.

Figure 13:
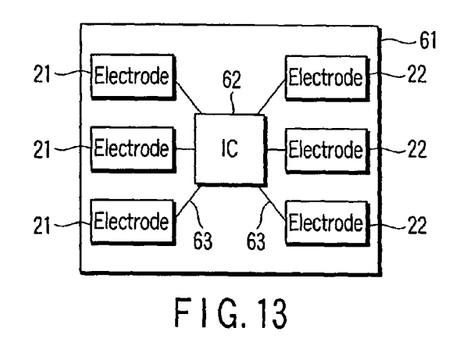
FIG. 13 is a schematic view illustrating a structure example of the sensor device of the embodiment.

FIG. 13 schematically shows a first configuration example. In this example, charge-induced electrodes 21 and 22 and a circuit portion 62 formed of an IC are provided on the same substrate 61. That is, the charge-induced electrodes 21 and 22 and a circuit portion 62 are provided on the same plane. The circuit portion 62 includes various circuits such as a difference detector 41 and comparator 42 (see FIG. 2). The charge-induced electrodes 21 and 22 are connected to the circuit portion 62 by wires 63. By thus providing the charge-induced electrodes 21 and 22 and circuit portion 62 on the same substrate 61 (i.e., on the same plane), a compact mount structure is realized. However, if necessary, the circuit portion 62 may be provided on another substrate. Further, although FIG. 13 shows mounting of the charge-induced electrodes 21 and 22, the charge-holding electrodes 11 and 12 can be mounted in the same way. Namely, the charge-holding electrodes 11 and 12 and a circuit portion formed of an IC can be provided on the same substrate. These substrates are mounted on the members 10 and 20, whereby the charge-holding electrodes 11 and 12 and charge-induced electrodes 21 and 22 are mounted on the surface of the members 10 and 20.

Figure 14:
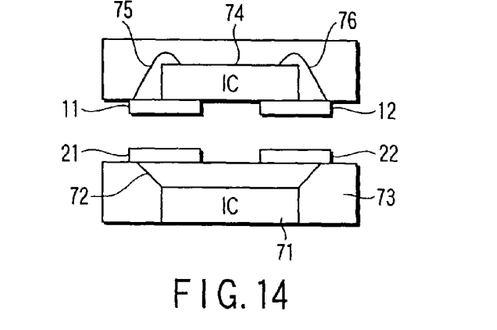
FIG. 14 is a schematic view illustrating another structure example of the sensor device of the embodiment.

FIG. 14 schematically shows a second configuration example. In this example, the charge-induced electrodes 21 and 22 cover at least part of a circuit portion 71 formed of an IC. The circuit portion 71 includes various circuits such as a difference detector 41 and comparator 42 (see FIG. 2). The charge-induced electrodes 21 and 22 are connected to the circuit portion 71 by wires 72. The circuit portion 71 and wires 72 are covered with a mold resin 73. Since thus, the charge-induced electrodes 21 and 22 cover at least part of the circuit portion 71, the area required for mounting can be reduced, thereby enabling a compact mount structure. The charge-holding electrodes 11 and 12 can be mounted in the same way as shown in FIG. 14. Namely, the charge-holding electrodes 11 and 12 are connected to a circuit portion 74 by wires 75. The circuit portion 74 and wires 75 are covered with a mold resin 76.

Although, in the example of FIG. 14, the charge-holding electrodes 11 and 12 and charge-induced electrodes 21 and 22 are provided outside the package of the mold resin 73, they may be provided in the package. In this case, a more compact mount structure can be realized.

Figure 15:
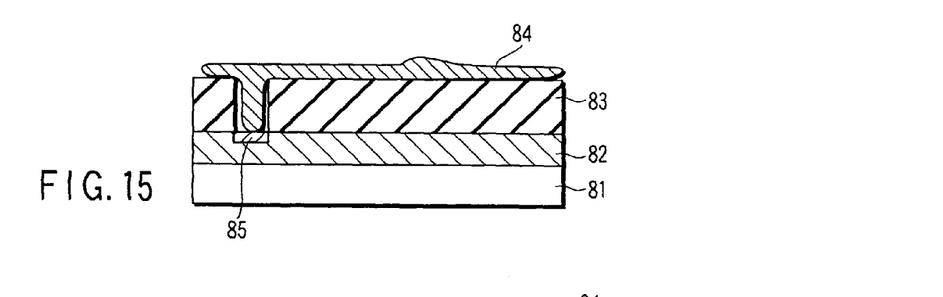
FIG. 15 is a sectional view illustrating yet another structure example of the sensor device of the embodiment.

FIG. 15 schematically shows a third configuration example. In this example, a charge-induced electrode 84 covers at least part of a circuit portion 82. Specifically, the circuit portion 82 is provided on a substrate 81 and covered with a mold resin 83. The charge-induced electrode 84 is provided by plating on the mold resin 83 (actually, a plurality of charge-induced electrodes 84 are provided). The mold resin 83 has a hole formed therein for electrically connecting the charge-induced electrode 84 to a pad 85 incorporated in the circuit portion 82. Since, in this example, too, the charge-induced electrode 84 covers at least part of the circuit portion 82, the required mounting area can be reduced, and a compact mount structure can be realized. A charge-holding electrode can also be mounted in the same way as the charge-induced electrode.

Figure 16:
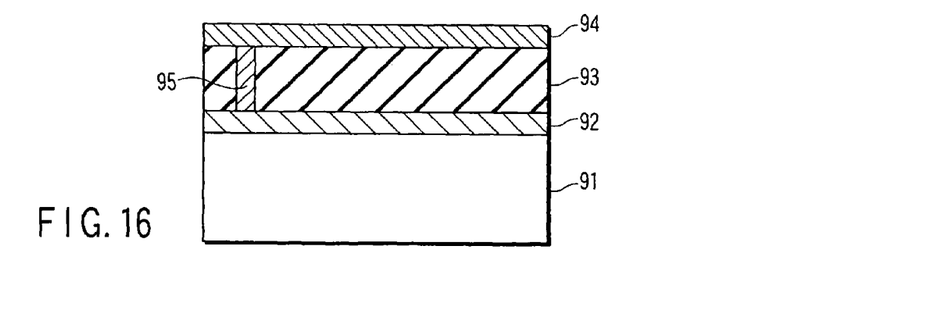
FIG. 16 is a sectional view illustrating another structure example of the sensor device of the embodiment.

FIG. 16 schematically shows a fourth configuration example. Also in this example, a charge-induced electrode 94 covers at least part of a circuit portion 92. Specifically, the circuit portion 92 is provided on a semiconductor substrate (e.g., silicon substrate) 91 by a standard integrated circuit forming technique, and is covered with an insulating film 93. The charge-induced electrode 94 is provided on the insulating film 93 (actually, a plurality of charge-induced electrodes 94 are provided). The insulating film 93 has a via hole formed therein, and the charge-induced electrode 94 is electrically connected to the circuit portion 92 via a conductor 95 provided in the via hole. Since, in this example, too, the charge-induced electrode 94 covers at least part of the circuit portion 92, the required mounting area can be reduced, and a compact mount structure can be realized. A charge-holding electrode can also be mounted in the same way as the charge-induced electrode.

In the above-described examples, the sensor device is used for detecting the opening/closing of a portable communication terminal, such as a cellular phone. However, the sensor device can be also used for detecting the opening/closing of other electronic equipments, such as a personal computer, refrigerator, oven range and door.

Figure 17:
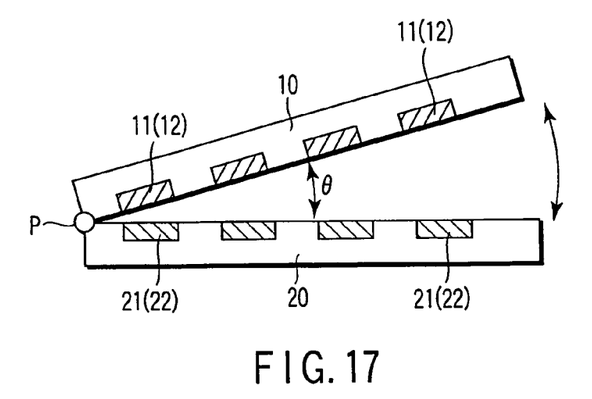
FIG. 17 is a sectional view illustrating a case where the sensor device of the embodiment is used as an angle detection sensor.
Figure 18A:
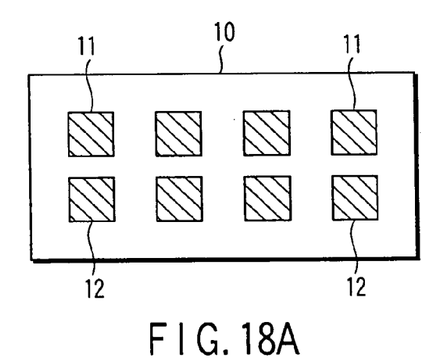
FIGS. 18A and 18B are plan views illustrating cases where the sensor device of the embodiment is used as an angle detection sensor.
Figure 18B:
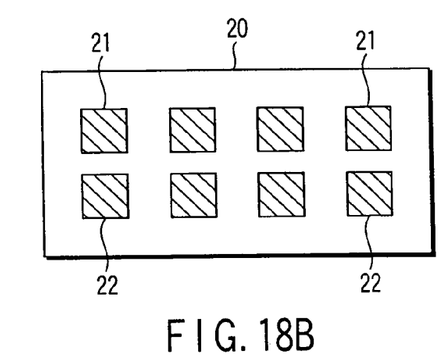

FIGS. 17, 18A and 18B show a case where the sensor device of the embodiment is used as an angle detection sensor. FIG. 17 is a cross sectional view of the sensor, and FIGS. 18A and 18B are plan views of the same.

As shown in FIGS. 17 and 18A, charge-holding electrodes 11 and 12 are arranged in pairs on the first member 10 between both ends thereof. Similarly, as shown in FIGS. 17 and 18B, charge-induced electrodes 21 and 22 are arranged in pairs on the second member 20 between both ends thereof. Further, an end of the first member 10 is connected to an end of the second member 20. The first and second members 10 and 20 can angularly move relative to each other about a connection point P there between, as is indicated by the arrow in FIG. 17.

As can be understood from FIGS. 17, 18A and 18B, as the angle θ between the members 10 and 20 is decreased, the number of pairs (21, 22) of induced electrodes that are turned on (proximity detection state) is increased. Accordingly, if the relationship between the on/off states of each pair (21, 22) of induced electrodes and the angle θ is obtained beforehand, the angle θ can be determined from the on/off states of each pair (21, 22) of induced electrodes. This means that variations in the angle θ can be measured in an analog fashion if the number of pairs of charge-holding electrodes (11, 12) and charge-induced electrodes (21 and 22) is increased. As a result, an angle detector of a simple structure can be realized.

Figure 19:
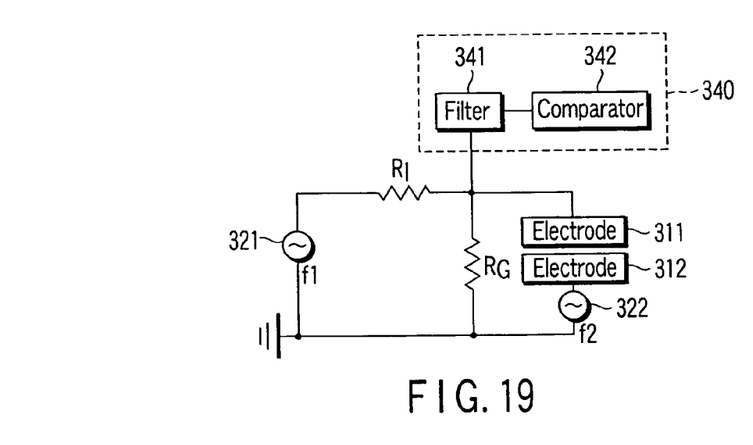
FIG. 19 is a circuit diagram illustrating another structure of the sensor device of the embodiment.

FIG. 19 shows another structure of the sensor device according to the embodiment.

The sensor device of FIG. 19 also detects the positional relationship (e.g., opening/closing states) between a first member (corresponding to the member 10 shown in, for example, FIGS. 1 and 3-6), and a second member (corresponding to the member 20 shown in, for example, FIGS. 1 and 3-6).

A first electrode 311 is provided on the surface of the first member, and a second electrode 312 is provided on the surface of the second member. An AC signal having a first frequency f1 is supplied from a first AC signal generator 321 to the first electrode 311. An AC signal having a second frequency f2 is supplied from a second AC signal generator 322 to the second electrode 312. The difference between the first and second frequencies f1 and f2 is sufficiently smaller than each of the frequencies f1 and f2. RI denotes an input resistance, and RG denotes a floating resistance.

When the first and second members are closed, the first and second electrodes 311 and 312 approach each other. As a result, a beat corresponding to the difference between the first and second frequencies f1 and f2 occurs. The beat frequency component is detected by a beat detector 340. The beat detector 340 comprises a low-pass filter (LPF) 341 and comparator 342. Namely, the LPF 341 extracts a beat frequency component. The comparator 342 compares the level of the beat frequency component extracted by the LPF 341 with a reference voltage, and outputs a beat detection signal if the former exceeds the latter.

As described above, in the above structure, a beat occurs when the first and second electrodes 311 and 312 approach each other in accordance with a change in the positional relationship between the first and second members. Accordingly, the positional relationship (e.g., opening/closing states) between the first and second members can be reliably detected by detecting a beat frequency component by the beat detector 340.

Further, since the detected beat frequency component corresponds to the difference between the first and second frequencies f1 and f2, only the proximity of the first and second electrodes 311 and 312 can be reliably detected. This enables a sensor device simple in structure to reliably detect only the proximity of a particular detection target.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A sensor device for detecting a positional relationship between a first member and a second member, comprising:
   a first charge-holding electrode provided on a surface of the first member and holding a charge;
   a second charge-holding electrode provided on the surface of the first member and holding a charge differing from the charge held by the first charge-holding electrode;
   a first charge-induced electrode provided on a surface of the second member, the first charge-induced electrode having a charge induced therein in accordance with the charge held by the first charge-holding electrode, when the positional relationship between the first and second members changes to cause the first charge-holding electrode to approach the first charge-induced electrode;
   a second charge-induced electrode provided on the surface of the second member, the second charge-induced electrode having a charge induced therein in accordance with the charge held by the second charge-holding electrode, when the positional relationship between the first and second members changes to cause the second charge-holding electrode to approach the second charge-induced electrode; and
   a difference detector which generates a difference detection signal indicative of the positional relationship when a difference between the charge induced in the first charge-induced electrode and the charge induced in the second charge-induced electrode is greater than a preset value.

2. The device according to claim 1, wherein the charges held by the first and second charge-holding electrodes differ in polarity.

3. The device according to claim 1, wherein the charges held by the first and second charge-holding electrodes differ in absolute value.

4. The device according to claim 1, wherein the device comprises a plurality of detection units each including the first and second charge-holding electrodes, the first and second charge-induced electrodes, and the difference detector.

5. The device according to claim 4, further comprising an output signal generation unit which generates an output signal when all the difference detectors generate the difference detection signal.

6. The device according to claim 4, further comprising an output signal generation unit which generates an output signal when at least one of the difference detectors generate the difference detection signal.

7. The device according to claim 1, wherein the charges held by the first and second charge-holding electrodes are variable.

8. The device according to claim 1, further comprising a charge supply which supplies charges to the first and second charge-holding electrodes.

9. The device according to claim 1, wherein the first and second charge-holding electrodes are formed of electrets.

10. The device according to claim 1, wherein a circuit portion including the difference detector, and the first and second charge-induced electrodes are provided on the same plane.

11. The device according to claim 1, wherein the first and second charge-induced electrodes cover at least part of a circuit portion including the difference detector.

12. The device according to claim 1, wherein:
 a plurality pairs of the first and second charge-holding electrodes are arranged between both ends of the first member;
 a plurality pairs of the first and second charge-induced electrodes are arranged between both ends of the second member; and
 the first and second members are connected to each other at the one ends thereof.

13. A portable communication terminal provided with the sensor device according to claim 1.

14. An electronic device provided with the sensor device according to claim 1.

15. A sensor device for detecting a positional relationship between a first substrate and a second substrate, comprising:
 a first charge-holding electrode provided on a surface of the first substrate and holding a charge;
 a second charge-holding electrode provided on the surface of the first substrate and holding a charge differing from the charge held by the first charge-holding electrode;
 a first charge-induced electrode provided on a surface of the second substrate, the first charge-induced electrode having a charge induced therein in accordance with the charge held by the first charge-holding electrode, when the positional relationship between the first and second substrates changes to cause the first charge-holding electrode to approach the first charge-induced electrode;
 a second charge-induced electrode provided on the surface of the second substrate, the second charge-induced electrode having a charge induced therein in accordance with the charge held by the second charge-holding electrode, when the positional relationship between the first and second substrates changes to cause the second charge-holding electrode to approach the second charge-induced electrode; and
 a difference detector which generates a difference detection signal indicative of the positional relationship when a difference between the charge induced in the first charge-induced electrode and the charge induced in the second charge-induced electrode is greater than a preset value.

16. The device according to claim 15, wherein the difference detector is provided on the second substrate.

17. An electronic device comprising:
 a first member and a second member movable relative to each other;
 a first charge-holding electrode provided on a surface of the first member and holding a charge;
 a second charge-holding electrode provided on the surface of the first member and holding a charge differing from the charge held by the first charge-holding electrode;
 a first charge-induced electrode provided on a surface of the second member, the first charge-induced electrode having a charge induced therein in accordance with the charge held by the first charge-holding electrode, when the positional relationship between the first and second members changes to cause the first charge-holding electrode to approach the first charge-induced electrode;
 a second charge-induced electrode provided on the surface of the second member, the second charge-induced electrode having a charge induced therein in accordance with the charge held by the second charge-holding electrode, when the positional relationship between the first and second members changes to cause the second charge-holding electrode to approach the second charge-induced electrode; and
 a difference detector which generates a difference detection signal indicative of a positional relationship when a difference between the charge induced in the first charge-induced electrode and the charge induced in the second charge-induced electrode is greater than a preset value.

* * * * *